United States Patent
Kim et al.

(10) Patent No.: US 10,164,632 B2
(45) Date of Patent: Dec. 25, 2018

(54) IONIC ELASTOMER BASED CAPACITOR TYPE TACTILE SENSOR AND METHOD FOR MANUFACTURING THE SAME

(71) Applicants: SOONGSIL UNIVERSITY RESEARCH CONSORTIUM TECHNO PARK, Seoul (KR); INDUSTRY-UNIVERSITY COOPERATION FOUNDATION HANYANG UNIVERSITY, Seoul (KR)

(72) Inventors: Do Hwan Kim, Anyang-si (KR); Hee Tae Jung, Daejeon (KR); Sang Sik Park, Seoul (KR); Ming Liang Jin, Daejeon (KR)

(73) Assignees: SOONGSIL UNIVERSITY RESEARCH CONSORTIUM TECHNO-PARK, Seoul (KR); UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 15/249,592

(22) Filed: Aug. 29, 2016

(65) Prior Publication Data
US 2017/0059417 A1    Mar. 2, 2017

(51) Int. Cl.
*H03K 17/96* (2006.01)
*G01L 1/14* (2006.01)
(Continued)

(52) U.S. Cl.
CPC ............ *H03K 17/962* (2013.01); *G01L 1/142* (2013.01); *G06F 3/044* (2013.01); *G06F 3/0414* (2013.01); *G06F 2203/04105* (2013.01)

(58) Field of Classification Search
CPC . H03K 17/96; G06F 3/01; H01B 1/20; G03K 17/96; G01L 9/0072; G01L 1/142; G01L 3/106
(Continued)

(56) References Cited

U.S. PATENT DOCUMENTS 7,567,681 B2 *   7/2009  Pelrine ..................... B64C 3/48
                                                       381/176
9,136,035 B2 *   9/2015  Itou ........................... H01B 1/22
(Continued)

FOREIGN PATENT DOCUMENTS

EP    1 437 584 A1    7/2004
EP    2 239 537 A1    10/2010
(Continued)

OTHER PUBLICATIONS

Sarwar, et al., "Transparent and Conformal 'Piezolonic' Touch Sensor", Optomechatronic Micro/Nano Devices and Components III, Oct. 1-10, 2007, Lausanne, Switzerland, Proceedings of SPIE, vol. 9430, Apr. 1, 2015, p. 943026.
(Continued)

*Primary Examiner* — Jonathan Dunlap
*Assistant Examiner* — Octavia Hollington
(74) *Attorney, Agent, or Firm* — Sughrue Mion, PLLC (57) ABSTRACT

A capacitor type tactile sensor and a method of manufacturing the capacitor type tactile sensor are provided. To elaborate, the device includes a first electrode, an active layer formed on a top surface of the first electrode, and a second electrode formed on a top surface of the active layer. The active layer is made of ionic elastomer, and a concentration of effective ions within the active layer is adjusted by an external pressure.

4 Claims, 12 Drawing Sheets

(51) Int. Cl.
*G06F 3/041* (2006.01)
*G06F 3/044* (2006.01)

(58) Field of Classification Search
USPC .................................................... 73/862.626
See application file for complete search history.

(56) References Cited

U.S. PATENT DOCUMENTS

| | | | |
|---|---|---|---|
| 9,231,186 B2* | 1/2016 | Busgen | F15D 1/12 |
| 9,235,265 B2* | 1/2016 | Karamath | G06F 3/016 |
| 9,658,120 B2* | 5/2017 | Otaka | G01L 1/146 |
| 2002/0130673 A1 | 9/2002 | Pelrine | |
| 2010/0288635 A1* | 11/2010 | Komiya | G01B 7/16 |
| | | | 204/406 |
| 2015/0114814 A1 | 4/2015 | Suzuki | |
| 2017/0059434 A1* | 3/2017 | Li | G01L 9/0072 |
| 2017/0356815 A1* | 12/2017 | Madden | A61B 5/0205 |

FOREIGN PATENT DOCUMENTS

| | | |
|---|---|---|
| JP | 05-036331 U | 5/1993 |
| KR | 10-2010-0116621 A | 11/2010 |
| WO | 2010/005992 A1 | 1/2010 |
| WO | 2013/044226 A2 | 3/2013 |
| WO | 2014/169119 A1 | 10/2014 |

OTHER PUBLICATIONS

Lavall, et al., "Novel Polymer Electrolytes Based on Thermoplastic Polyurethane and Ionic Liquid/Lithium Bis(trifluoromethanesulfonyl)imide/propylene Carbonate Salt System", Journal of Power Sources, Elsevier SA, CH, vol. 195, No. 17, Sep. 1, 2010, pp. 5761-5767.

European Search Report for 16185887.3 dated Feb. 6, 2017.

* cited by examiner

IONIC ELASTOMER BASED CAPACITOR TYPE TACTILE SENSOR AND METHOD FOR MANUFACTURING THE SAME

CROSS-REFERENCE TO RELATED APPLICATION

This application claims the benefit of Korean Patent Application No. 10-2015-0122502 filed on Aug. 31, 2015, the entire disclosure of which is incorporated herein by reference.

BACKGROUND

The various embodiments described herein pertain generally to an ionic elastomer-based capacitor type tactile sensor and a method of manufacturing the same.

Recently, with the rapid development of electronic data devices, mobile data communication devices and mobile smart devices have rapidly propagated. Next-generation electronic systems are expected to be developed to the extent that they can be attached to or inserted into a human body beyond just being mobile. Particularly, an artificial electronic skin or a tactile sensor capable of being bent, extended and attached to a skin or a body of a person or a flexure such as a joint is attracting attention.

Meanwhile, the tactile sensor is classified into two types: one using a resistance variation according to a deformation (piezo resistance effect) and the other using an electrostatic capacitance variation according to a variation in a gap between electrodes due to an external mechanical pressure. In general, the tactile sensor is manufactured through a silicon semiconductor process. Through the silicon semiconductor process, a micro channel can be formed and a high spatial resolution can be achieved. Further, performance of a sensor manufactured through this silicon semiconductor process is relatively high. Besides, if a well-established semiconductor CMOS technology is used together, a complicate signal processing problem can be solved by embedding a capacitor, a decoder, or the like in the tactile sensor. Despite these advantages, since a silicon material has low durability and is not flexible, attaching a silicon sensor to a curved surface has been impossible.

To solve the aforementioned problem, many active researches have been conducted to improve durability of the tactile sensor by using various materials and to develop a material capable of sensing even a very fine pressure/strain. Development of such a material is regarded as a core technology having a wide range of applications to various fields such as artificial electronic skins, tactile sensors, artificial prostheses, robotics, medical devices, and so forth.

In this regard, International Patent Publication No. WO2013/044226 (entitled "Artificial skin and elastic strain sensor") describes a technique using an elastic strain sensor which is equipped with an electrode and an elastic member having at least two channels and a strain axis to detect and trace a motion of a support structure. In this technique, the elastic strain sensor is configured to detect an electric resistance which is changed as cross sections of the channels are changed when a pressure is applied to the elastic member.

Since, however, such an artificial skin measures only a deformation of the elastic member caused by an external mechanical pressure, the electric resistance can only be detected sensitively within a limited pressure range. In order to detect all pressure ranges, different device structures need to be used for the individual pressure ranges. Thus, there has been a limit in achieving high integration of devices.

BRIEF SUMMARY

In view of the foregoing, exemplary embodiments provide an ionic elastomer-based capacitor type tactile sensor capable of, as a single sensor, detecting all pressure ranges sensitively by copying a Merkel cell of a human body.

However, the problems sought to be solved by the present disclosure are not limited to the above description, and other problems can be clearly understood by those skilled in the art from the following description.

In accordance with an exemplary embodiment, there is provided a capacitor type tactile sensor. The device may include a first electrode; an active layer formed on a top surface of the first electrode; and a second electrode formed on a top surface of the active layer. Herein, the active layer is made of ionic elastomer, and a concentration of effective ions within the active layer is adjusted by an external mechanical pressure.

In accordance with another exemplary embodiment, there is provided a method of manufacturing a capacitor type tactile sensor. The method may include: forming a first electrode on a top surface of a first substrate; forming an active layer on a top surface of the first electrode; forming a second electrode on a top surface of the active layer; and, placing a second substrate on a top surface of the second electrode. Herein, the active layer is made of ionic elastomer, and a concentration of effective ions within the active layer is adjusted by an external mechanical pressure.

According to the exemplary embodiments, the capacitor type tactile sensor has an effect of copying an operational principle of a Merkel cell.

Further, in the capacitor type tactile sensor proposed by the exemplary embodiments, since the single sensor reacts to all pressure ranges sensitively, the capacitor type tactile sensor of the exemplary embodiments is applicable to a wide variety of fields such as a haptic display, an electronic skin, and so forth.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Hereinafter, exemplary embodiments will be described in detail with reference to the accompanying drawings so that inventive concepts may be readily implemented by those skilled in the art. However, it is to be noted that the present disclosure is not limited to the exemplary embodiments but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate a connection or coupling of one element to another element and include both a case where an element is "directly connected or coupled to" another element and a case where an element is "electronically connected or coupled to" another element via still another element. Further, throughout the whole document, the term "comprises or includes" and/or "comprising or including" used in the document means that one or more other components, steps, operations, and/or the existence or addition of elements are not excluded in addition to the described components, steps, operations and/or elements In general, a skin at a human fingertip senses a texture and a temperature at a surface thereof at a pressure level of 10 kPa to 40 kPa with a spatial resolution of about 40 µm. Accordingly, assuming that the human fingertip has an area of about 1 cm×1 cm, the number of sensors that detect a pressure is 62,500, and the individual sensors measure the pressure in real time and transmit measurements to the brain.

A human skin consists of epidermis having a thickness ranging from 0.1 mm to 0.3 mm; dermis that exits under the epidermis; and subcutaneous fat. Receptors capable of detecting various physical quantities exit in the epidermis and the dermis. Stimuli at various parts of a human body and from the outside are detected through these receptors. The receptors convert detected chemical or optical energy to an electric signal and transmit the electric signal to the central nervous system. Here, different kinds of receptors detect different senses.

As an example, representative receptors that detect the sense of touch include a Meissner corpuscle, a Merkel receptor, a Pacinian corpuscle, a Ruffini corpuscle, and so forth. The Meissner corpuscle detects a skin movement best, and the Merkel receptor that exists between the epidermis and the dermis reacts to a skin-pressing sense best and charges a part of a function of recognizing a vibration. The Pacinian corpuscle is located at the deepest position of the skin and recognizes a movement, a fine contact and a fine vibration. Further, the Ruffini corpuscle is located at a deep position of the skin, has a spindle structure and detects a pressure and a temperature variation.

From the viewpoint of a tactile sensor, the human skin has a structure in which active sensors (i.e., receptors, neurons) that measure individual physical quantities are embedded in a material (i.e., dermis) having viscoelasticity.

In this regard, an exemplary embodiment provides an elastomer-based capacitor type tactile sensor capable of detecting all pressure ranges sensitively by copying, among various receptors that exist in the human skin, Merkel cells clustered at a touch-sensitive part. Hereinafter, the capacitor type tactile sensor designed to copy the Merkel cells will be described in detail with reference to the accompanying drawings.

FIG. 1A to FIG. 1F are conceptual diagrams providing a comparison of ion exchange principles in a Merkel cell and the capacitor type tactile sensor according to the present exemplary embodiment.

Figure 1A:
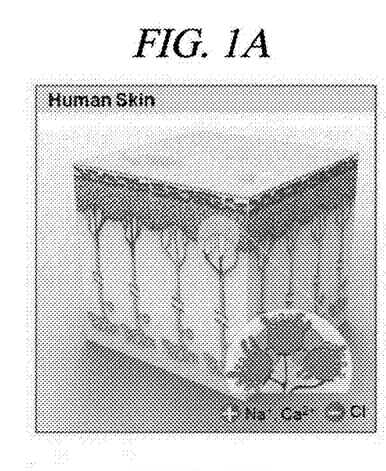
FIG. 1A to FIG. 1F are conceptual diagrams providing a comparison of ion exchange principles in a capacitor type tactile sensor and a Merkel cell.
Figure 1B:
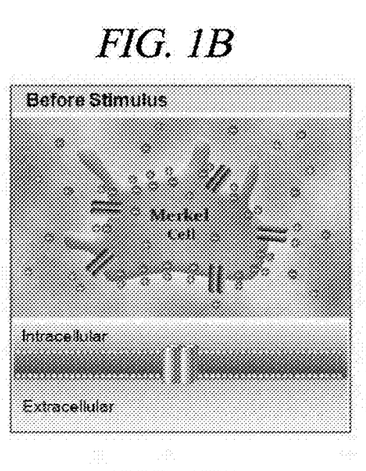

FIG. 1A is a diagram illustrating the dermis of the human skin; FIG. 1B, a diagram illustrating a state of a Merkel cell within the dermis before an external stimulus is applied; and FIG. 1C, a diagram illustrating a variation in ion concentrations inside and outside the Merkel cell when an external stimulus is applied.

Figure 1C:
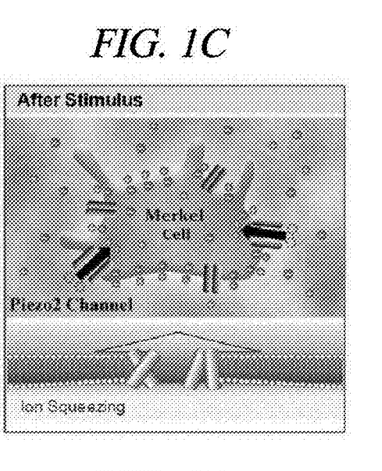

As can be seen from FIG. 1A to FIG. 1C, a close channel within the Merkel cell is opened by the external stimulus, and ion squeezing takes place from the outside of the Merkel cell to the inside thereof.

At this time, the channel that exists within the Merkel cell is a Piezo-type mechanosensitive ion channel component 2 (Piezo2) and is activated by physical stimulation of a cell membrane. Accordingly, if the mechanosensitive ion channel is activated by a mechanism stimulus, permeability of cations increase, and film depolarization occurs. Thus, the physical stimulus is converted to a receptor potential, and a signal is transmitted to the central nervous system.

Figure 1D:
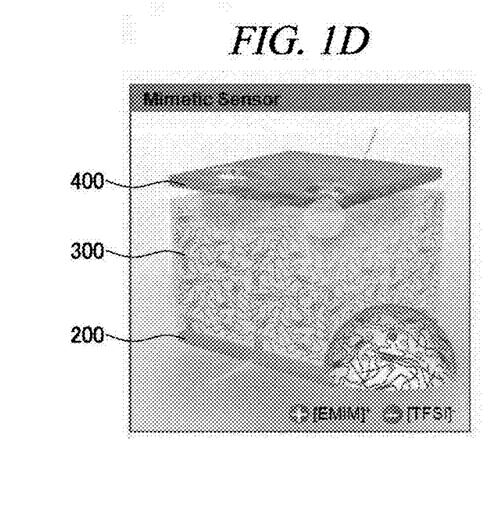
Figure 1E:
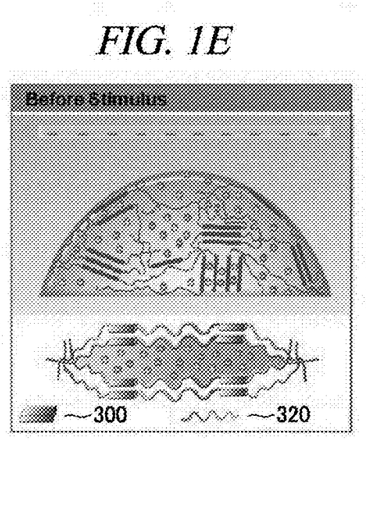
Figure 1F:
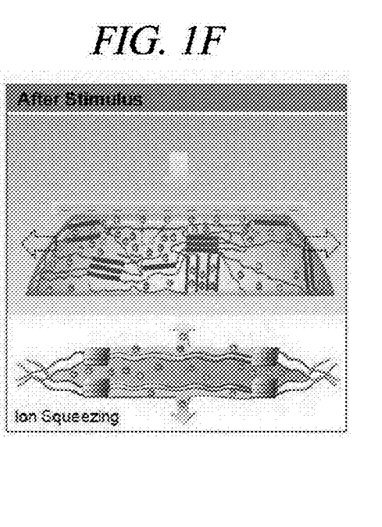

FIG. 1D to FIG. 1F are conceptual diagrams illustrating the capacitor type tactile sensor according to the present exemplary embodiment. As depicted in FIG. 1D, the capacitor type tactile sensor according to the exemplary embodiment includes an active layer 300, a first electrode 200 formed under the active layer 300; and a second electrode 400 formed on the active layer 300. The active layer 300 is made of ionic elastomer. Here, the shape of the active layer 300 is not particularly limited. By way of example, the active layer may have a rectangular shape or may have a hemispheric shape, as illustrated in FIG. 1E and FIG. 1F.

FIG. 1E illustrates the active layer 300 having a hemispheric shape. Particularly, FIG. 1E depicts states of the active layer 300 and the second electrode 400 before a stimulus is applied. To elaborate, the active layer 300 includes cations, anions, hard segments 310 and soft segments 320. Here, the segments partition the inside of the active layer 300 and isolate the ions. Further, the second electrode 400 formed on the active layer 300 is negatively charged before the stimulus is applied.

The active layer according to the exemplary embodiment may be formed by using a matrix solution (IL/TPU) of thermoplastic polyurethane (TPU) and ionic liquid (IL).

Figure 2A:
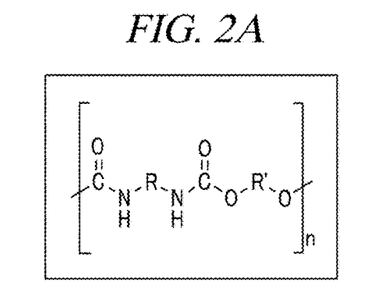
FIG. 2A and FIG. 2B are diagrams illustrating examples of ions contained thermoplastic polyurethane (TPU) and ionic liquid used in an exemplary embodiment.
Figure 2B:
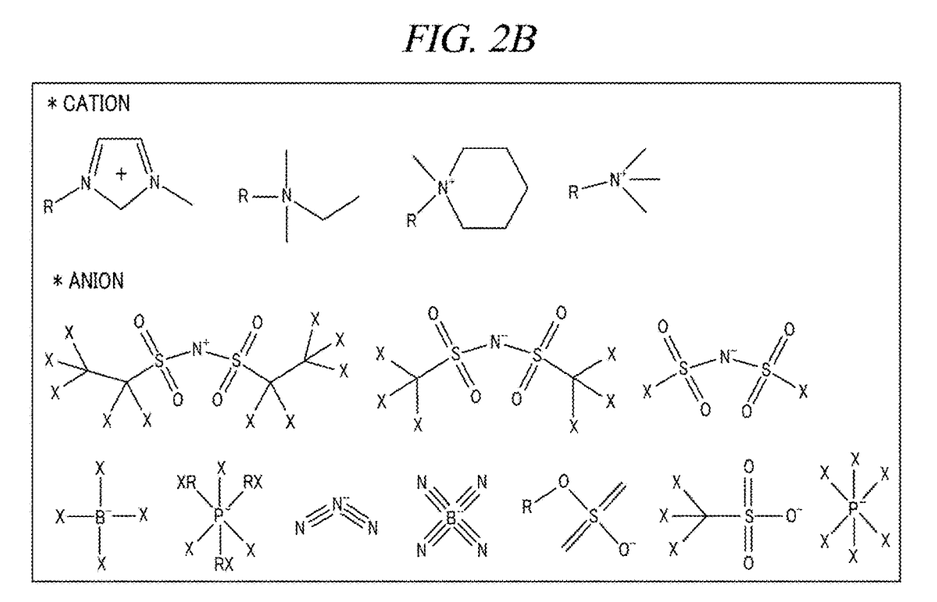

FIG. 2A and FIG. 2B illustrate the thermoplastic polyurethane and an example of ions contained in the ionic liquid used in the exemplary embodiment, respectively. Specifically, FIG. 2A illustrates a structure of the thermoplastic polyurethane, and FIG. 2B illustrate an example of ions contained in the ionic liquid. In FIG. 2A and FIG. 2B, X represents halogen atoms, and R denotes alkyl groups.

As depicted in FIG. 2A and FIG. 2B, the thermoplastic polyurethane is generally segmented block copolymer composed of hard segments as rigid molecular chains and soft segments having a flexible structure.

The hard segments have a glass transition temperature (Tg) higher than a room temperature. Accordingly, physical bridging points are formed between hard segments having glassy property through crystallization, hydrogen bonding, or bonding by a Van der Waals force. Meanwhile, the soft segments have a glass temperature lower than the room temperature. Accordingly, the soft segments serve to add important properties required for an elastic body having rubber property, that is, high elongation, high elasticity, high elastic recovery rate, and so forth. If an external force is applied to these segments, not only the orientation of the segments but also the structures thereof may be changed.

Referring back to FIG. 1F, when a stimulus (pressure) is applied from the outside in a direction from the second electrode 400 to the active layer 300, the active layer 300 made of the flexible ionic elastomer is deformed by the external stimulus. An upper end of the hemispheric active layer 300 is found to be deformed by a pressure applied thereto when it comes into contact with the second electrode 400.

At this time, as the upper end of the active layer 300 comes into contact with the second electrode 400, the cations within the active layer are moved to the vicinity of the second electrode 300 which is charged negatively. This means that electrical double layer (EDL) is introduced at the interface of active layer and electrode. Furthermore, the shapes of the segments which partition the inside of the active layer 300 are changed, and the ions isolated within the segments are released out. This phenomenon is similar to the phenomenon in FIG. 1C where the Piezo2 channel is opened when the Merkel cell receives a stimulus and ions are squeezed into the channel.

Figure 3A:
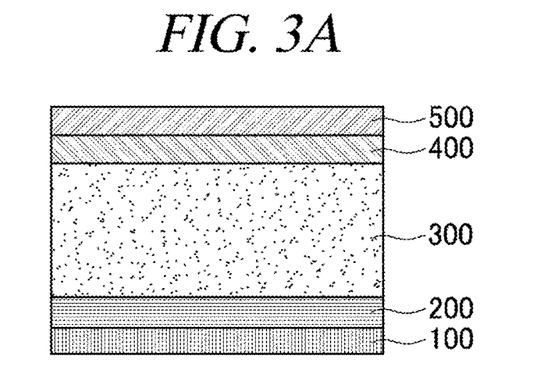
FIG. 3A and FIG. 3B are conceptual diagrams illustrating an operational principle of a capacitor type tactile sensor according to the exemplary embodiment.
Figure 3B:
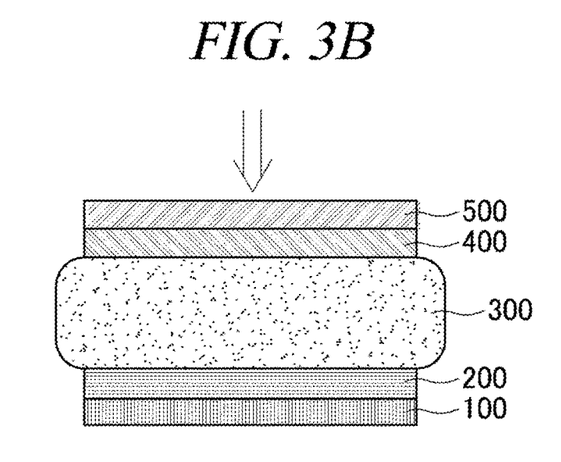

FIG. 3A and FIG. 3B are diagrams schematically illustrating a configuration and an operational principle of the capacitor type tactile sensor according to the exemplary embodiment.

FIG. 3A and FIG. 3B illustrate states before and after a pressure is applied in case that the active layer has a rectangular shape.

First, referring to FIG. 3A, the capacitor type tactile sensor includes a first substrate 100, the first electrode 200, the active layer 300, the second electrode 400 and a second substrate 500. Further, though not shown, this tactile sensor may further include a controller configured to detect capacitance formed between the first electrode 200 and the second electrode 400 and detects an external mechanical pressure based on the capacitance.

Depending on users' purpose, the active layer 300 and the second electrode 400 may be configured to be in contact with each other from the beginning, or may be spaced apart from each other at a preset distance without being in contact with each other.

As aforementioned in FIG. 1E, the active layer 300 includes the segments, and the segments partition the inside of the active layers 300 and capture a certain concentration of ions therein.

Since the active layer 300 has elasticity, it is contracted as illustrated when a pressure is applied thereto. If the active layer 300 is contracted by the external mechanical pressure, the shapes of the segments within the active layer 300 are changed, and the ions confined in the segments are released out of the segments into the active layer 300. As a result, a concentration of effective ions contributing to a capacitance value within the active layer 300 is increased.

FIG. 4A to FIG. 4D are conceptual diagrams illustrating a configuration and an operational principle of a capacitor type tactile sensor according to a second exemplary embodiment.

Figure 4A:
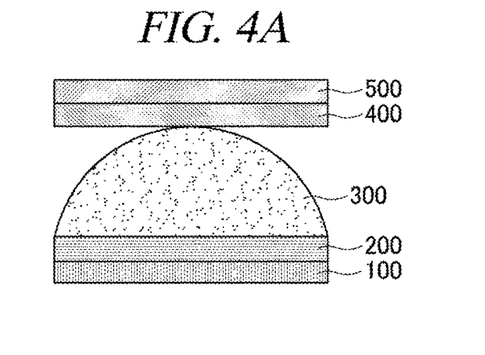
FIG. 4A to FIG. 4D are conceptual diagrams illustrating an operational principle of a capacitor type tactile sensor according to another exemplary embodiment.
Figure 4B:
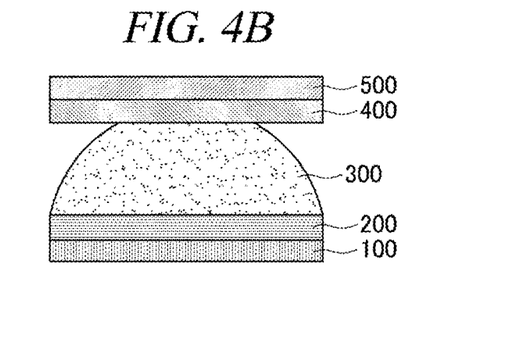

FIG. 4A to FIG. 4B illustrates a phenomenon which takes place within a single unit of a pillar structure.

Referring to FIG. 4A to FIG. 4B, the capacitor tactile sensor equipped with an active layer 300 having a hemispheric pillar structure is capable of adjusting a contact surface based on the intensity of an external mechanical pressure. Thus, the hemispheric shape can be adjusted to be fit for the user's purpose. That is, the active layer 300 may have any of various shapes besides the pillar structure as long as it has a convex-concave structure capable of increasing a contact surface with a second electrode 500 by the application of the external force.

If the external mechanical pressure is applied in a direction from the second electrode 400 to the active layer 300, a part of the active layer 300 having the hemispheric pillar structure is brought into contact with the second electrode 400 depending on the intensity of the applied pressure, as illustrated in FIG. 4B.

Figure 4C:
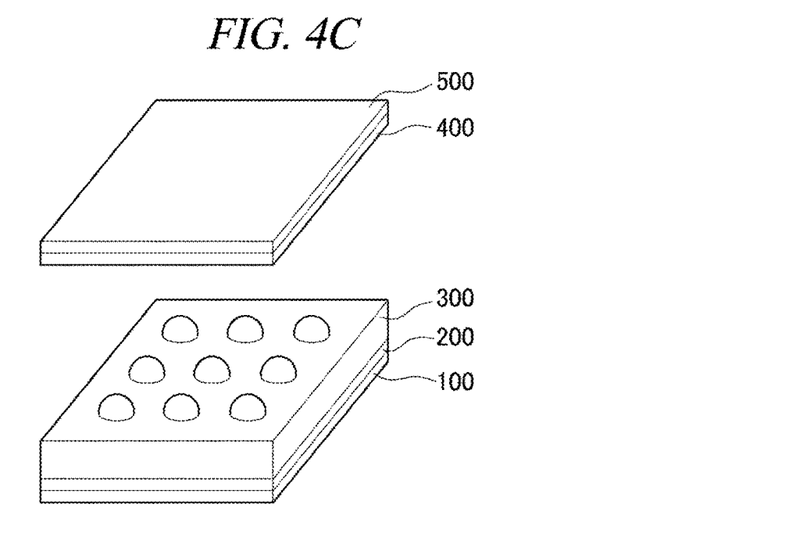

Meanwhile, as illustrated in FIG. 4C, the above-described pillar structure of the single unit may be plural in number, and they may be arranged in the form of an array.

Figure 4D:
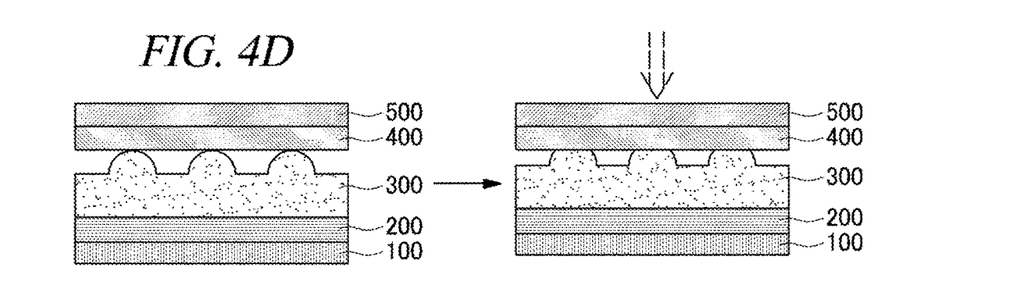

FIG. 4D illustrates a cross section of the capacitor type tactile sensor including the active layer 300 in which the hemispheric pillar-structured units according to the second exemplary embodiment are arranged in the form of an array. As depicted in FIG. 4D, in case that the multiple number of pillar structures are arranged in the form of the array, the active layer 300 having the multiple number of pillar structures may be deformed by an external mechanical pressure.

Now, referring to FIG. 5, a method of manufacturing the capacitor type tactile sensor according to the exemplary embodiment and functions of the individual components thereof will be described in further detail.

Figure 5:
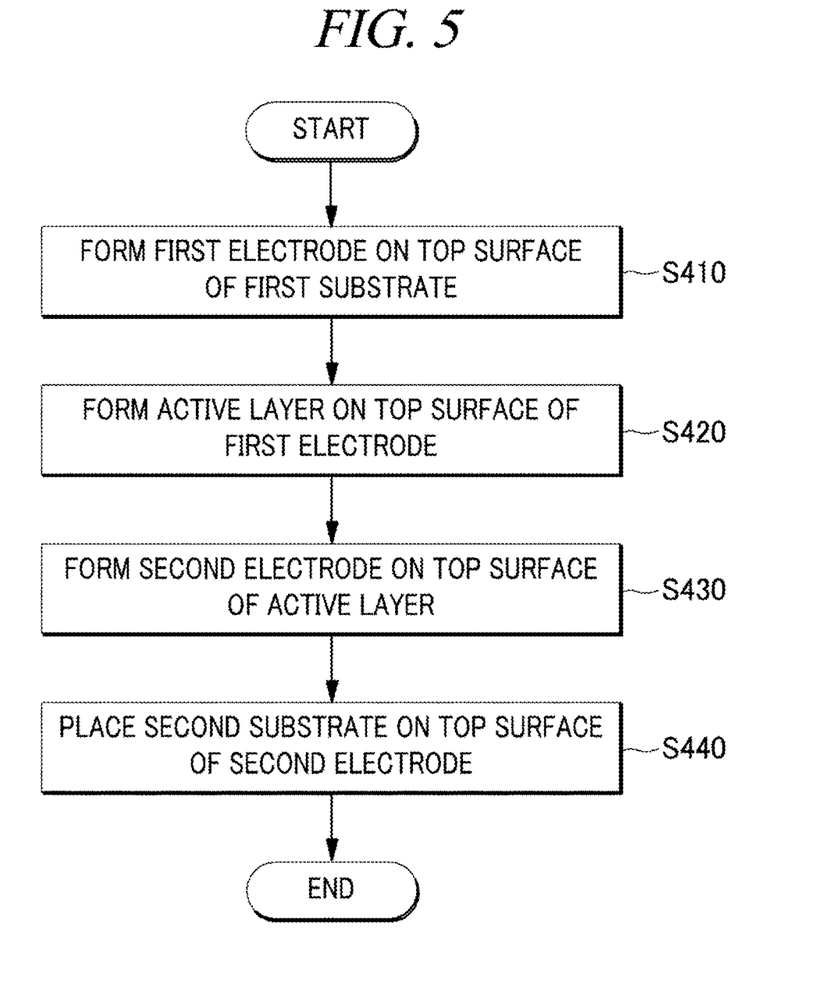
FIG. 5 is a flowchart for describing a manufacturing method for a capacitor type tactile sensor according to an exemplary embodiment.

FIG. 5 is a flowchart for describing the method of manufacturing the capacitor type tactile sensor according to the exemplary embodiment.

Referring to FIG. 5, the method of manufacturing the capacitor type tactile sensor according to the exemplary embodiment includes a process S410 of forming the first electrode 200 on a top surface of the first substrate 100, a process S420 of forming the active layer 300 on a top surface of the first electrode 200, a process S430 of forming the second electrode 400 on a top surface of the active layer 300, and a process S440 of placing the second substrate 500 on a top surface of the second electrode 400.

In a configuration in which the active layer 300 and the second electrode 400 are arranged not to be in contact with each other, the second electrode 400 and the second substrate 500 may be formed separately after the processes up to the process S420 may be performed. That is, the order for performing the process 430 of forming the second electrode 400 and the process S440 of placing the second substrate 500 on the top surface of the second electrode may not be limited to the example shown in FIG. 5, and may be performed in parallel with the process S410 and the process S420.

For reference, the first substrate 100 and the second substrate 500 are constituent components located at the bottommost layers of the capacitor type tactile sensor. The first substrate 100 and the second substrate 500 may be made of, by way of example, but not limitation, glass, ceramic, silicon, rubber or plastic. Here, thicknesses, sizes and shapes of the first and second substrates 100 and 200 may be designed in various ways, and, when necessary, the first and second substrates 100 and 200 may be omitted. The first substrate 100 and the second substrate 500 are in contact with and serve to support the first electrode 200 and the second electrode 400, respectively.

First, at the process S410 of forming the first electrode 200, the first electrode 200 may be formed through a photolithography process which is generally performed in a semiconductor process.

To elaborate, a material for forming the first electrode 200 may be deposited on the top surface of the first substrate 100 by any one of a thermal evaporation method, an e-beam evaporation method and a sputtering method. Here, however, the method of forming the material for the first electrode 200 is not limited to the mentioned methods. By way of example, transcription, spray coating, vacuum filtration or electrospinning may also be possible depending on conditions involved.

The material forming the first electrode 200 may be an electrode material selected from a metal, a conductive metal oxide, conductive polymer, conductive carbon, a conductive nanoparticle and a nanoparticle inserted between organic materials or conductive materials.

Subsequently, to manufacture the electrode having a required shape, a photosensitive material may be coated, and a pattern may be formed by exposing a certain portion of the photosensitive material to light. Then, by performing a dry or wet etching process, the electrode having the required shape can be formed.

Thereafter, at the process S420, the active layer 300 is formed on the top surface of the first electrode 200. In general, the active layer 300 may be formed through a molding process, an etching process or a spin coating process, but not limited thereto. The active layer according to the exemplary embodiment can be simply formed by spin coating ionic elastomer. However, in case of manufacturing the active layer having a convex-concave structure such as a hemispheric shape, a method of hardening liquid-phase ionic elastomer in a mold having a desired shape may be adopted.

Figure 6:
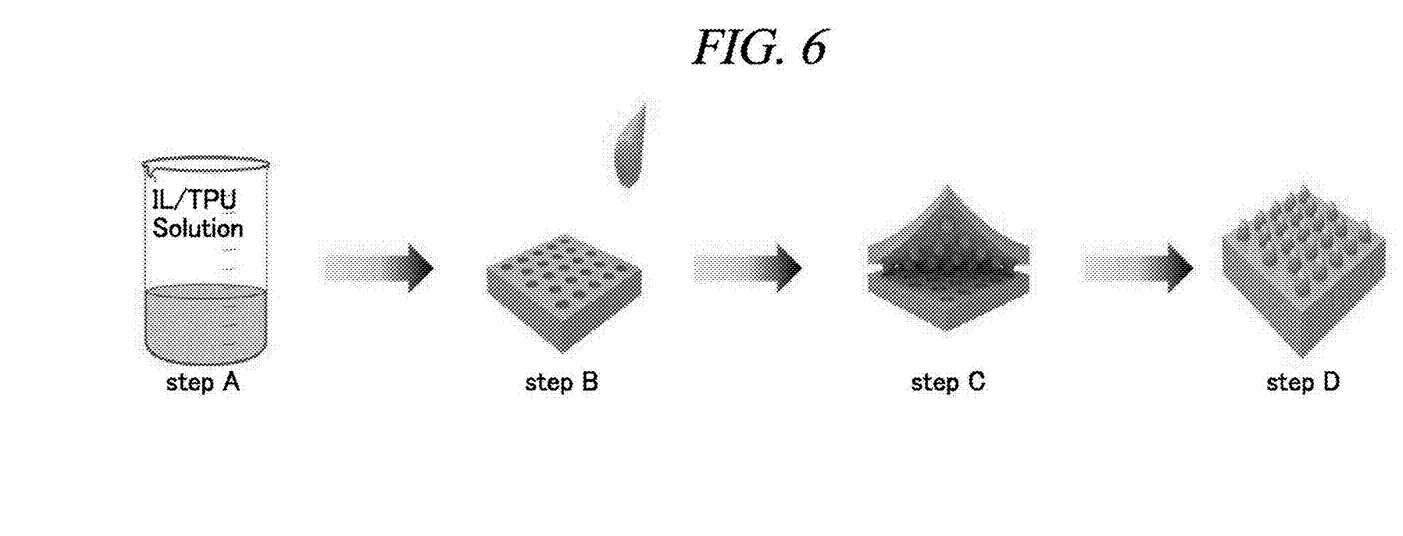
FIG. 6 is conceptual diagram for describing a manufacturing method for a pillar structure according to another exemplary embodiment.

Now, a method of forming an active layer will be further elaborated with reference to FIG. 6.

FIG. 6 is conceptual diagram illustrating a method of forming the active layer having the pillar structure according to the second exemplary embodiment.

First, as shown in FIG. 6, liquid ionic elastomer is prepared (step A). In the method of forming the active layer according to the exemplary embodiment, a matrix solution (IL/TPU) of thermoplastic polyurethane (TPU) and ionic liquid (IL) is used as the ionic elastomer. Next, as illustrated in FIG. 6, a mold having a convex-concave structure is prepared, and the liquid-phase ionic elastomer is injected into the mold having the convex-concave structure (step B). Then, as depicted in FIG. 6, the liquid-phase ionic elastomer is hardened, and the hardened ionic elastomer is then separated from the mold (step C). Through this process, the active layer 300 having the hemispheric structure is obtained (step D), as shown in FIG. 5D.

For reference, the ionic liquid is a salt that exists in the form of a liquid at a room temperature. Since this material itself is only composed of ions, it has high electric conductivity of about 10 mS/cm, wide electrochemical window of 4V or more and very low volatility. Viscosity of the ionic liquid is close to that of water. Meanwhile, TPU is transparent and elastic, and well-blends with the ionic liquid have high ion conductivity.

Accordingly, in the present exemplary embodiment, the active layer 300 is formed by using the liquid-phase ionic elastomer. Here, the active layer 300 includes segments, and the segments include hard segments and soft segments. These segments serve to partition the inside of the active layer 300 and capture a certain concentration of ions therein. Accordingly, if an external mechanical pressure is applied, the isolated regions inside the active layer 300 by the segments may be deformed, and the ions may be released out into the active layer 300. Here, the mechanism whereby the ions are released out copies the principle whereby ions are squeezed in a cell membrane of a Merkel cell. As stated above, the concentration of effective ions within the active layer 300 is adjusted by the external mechanical pressure, and, resultantly, a capacitance value of the capacitor type tactile sensor is adjusted. Referring back to FIG. 5, after the active layer 300 is formed on top of the first electrode 200, the second electrode 400 may be formed on the top surface of the active layer 300 (S430). At this time, the method of forming the second electrode 400 on the top surface of the active layer 300 is the same as the above-described method of forming the first electrode 200.

The first electrode 200 and the second electrode 400 respectively formed on and under the active layer 300 receive electric signals from a controller (not shown) and are capable of measuring resistance or a variation in capacitance caused by a potential difference applied thereto. Finally, at the process S440, the second substrate 500 is placed on the top surface of the second electrode 400. Since the second substrate 500 is the same as the first substrate as described above, explanation of the second substrate 500 will be omitted therein. As stated above, the process S430 of forming the second electrode 400 of FIG. 5 can be performed in parallel. Thus, the second electrode 400 and the second substrate 500 may be formed separately and placed on top of the active layer 300.

Figure 7:
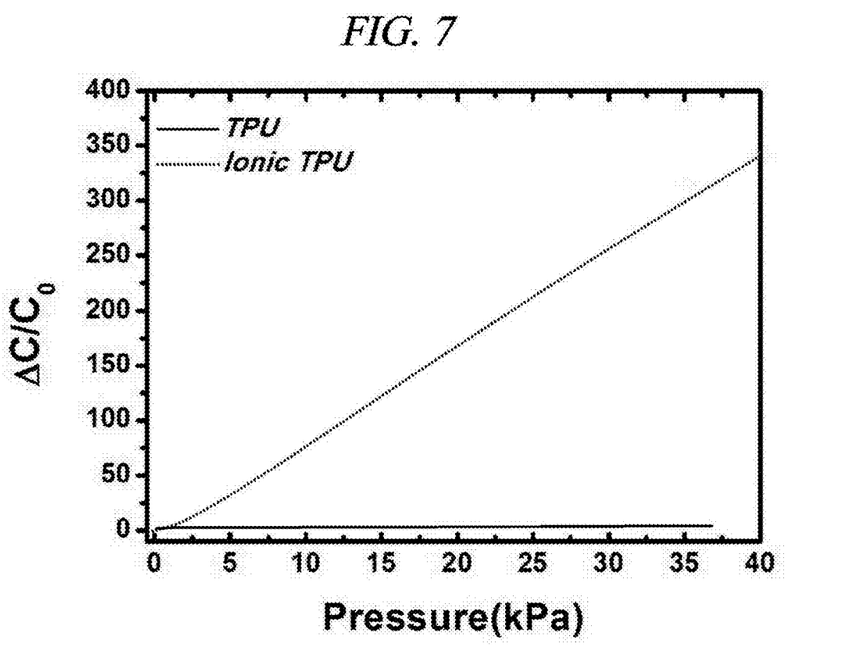
FIG. 7 is a graph showing a measurement result of a pressure-dependent capacitance variation of a capacitor type tactile sensor according to an exemplary embodiment.

FIG. 7 is a graph showing a measurement of a variation in capacitance by a pressure in the capacitor type tactile sensor according to the exemplary embodiment.

In comparison of TPU and ionic TPU, it is observed that the value of the capacitance increases with the rise of the pressure in case of the ionic TPU according to the present exemplary embodiment. However, the conventional TPU hardly shows a variation in capacitance.

As for the reason why the capacitance value increases in case of the ionic TPU, if the pressure is applied to the ionic TPU used as the active layer 300, the segments inside are deformed and the ions captured in the segments are released out. As a result, the concentration of effective ions in the surface of the active layer 300 is increased, so that ionic species on the surface thereof increases. The increased ions on the surface in turn increase electrostatic capacitance, which is transferred as an electric signal. As for another reason why the capacitance value increases in case of the ionic TPU, if the active layer 300 comes into contact with the second electrode 400, an electrical double layer (EDL) is formed and the pressure is applied to the ionic TPU. As a result, a contact area between the active layer 300 and the second electrode 400 increases with applied pressure, resulting in the increase of capacitance in the ionic TPU-based sensor device.

Further, as can be seen from FIG. 7, it is also proved that the capacitor type tactile sensor according to the exemplary embodiment is capable of measuring a pressure within a pressure range according to a set measurement range.

Figure 8A:
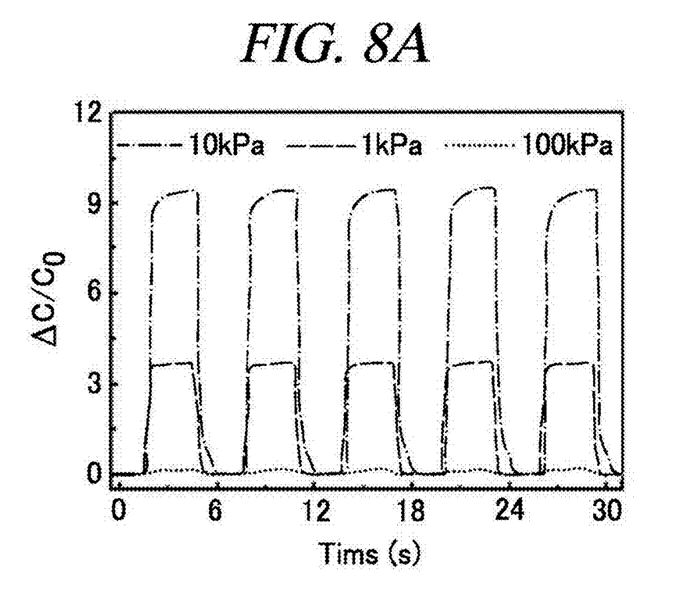
FIG. 8A to FIG. 8C are graphs showing test results of performance of the capacitor type tactile sensor according to the exemplary embodiment.
Figure 8B:
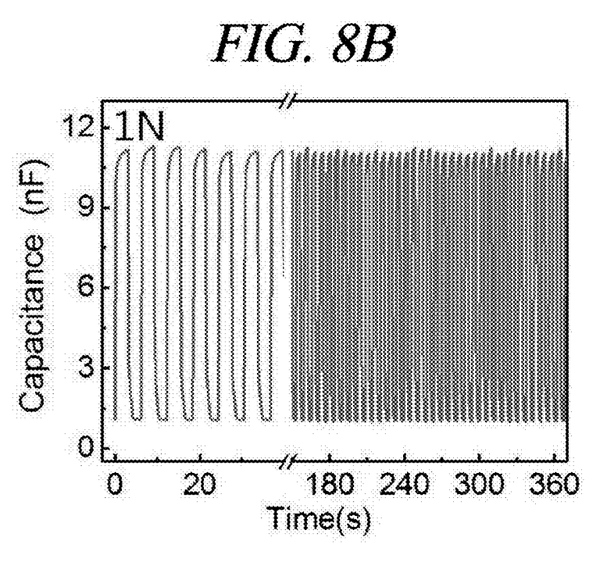
Figure 8C:
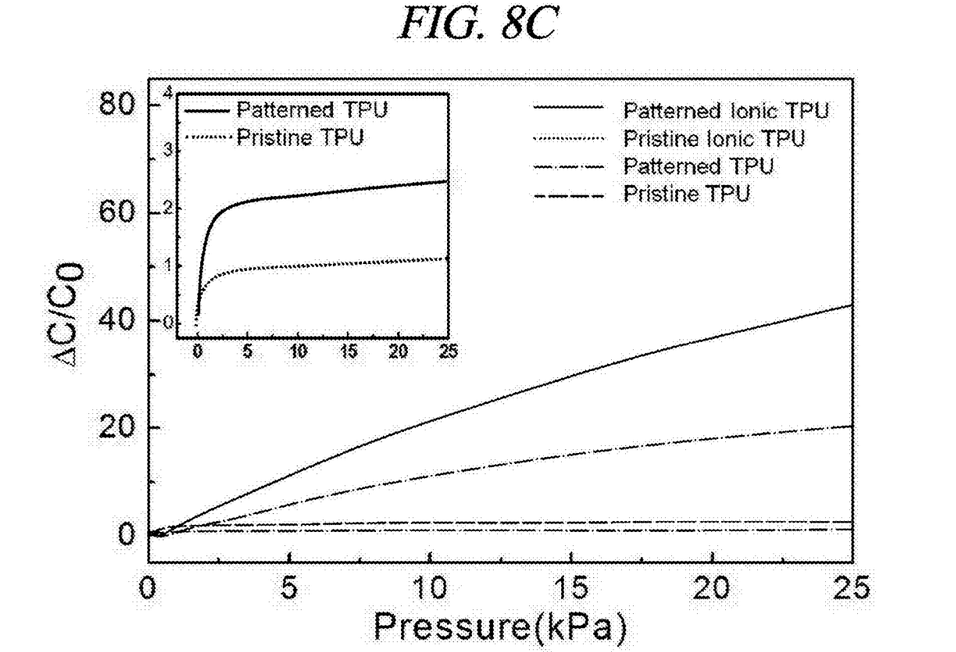

FIG. 8A to FIG. 8C are graphs showing test results of the capacitor type tactile sensor according to the exemplary embodiment.

FIG. 8A and FIG. 8B show responsiveness of the capacitor type tactile sensor of the present exemplary embodiment to a certain pressure. FIG. 8A shows a variation in capacitance when a stimulus is applied to the tactile sensor periodically at a pressure of 100 Pa, 1 kPa and 10 kPa, respectively. As can be seen from the graph, though the variation at the pressure of 100 Pa is small as compared to variations at the pressures of 1 kPa and 10 kPa, a regular graph pattern is still observed. Further, the variation in the capacitance when the pressure of 1 KPa is applied is about three times as large as the variation in the capacitance when the pressure of 10 kPa is applied, and each graph has a regular variation width with respect to the stimulus. Thus, it is proved that the capacitor type tactile sensor according to the present exemplary embodiment has reliability even when repetitive forces are applied.

FIG. 8B is a graph showing repetitive responsiveness of the capacitor type tactile sensor according to the exemplary embodiment. It is observed that a variation value in the capacitance is constant when an external mechanical pressure of 1N is applied repeatedly at a certain cycle for 360 seconds.

Further, FIG. 8C is a graph showing variations in capacitance by a pressure in respective cases where the active layer 300 of the capacitor type tactile sensor of the exemplary embodiment is TPU patterned into a hemispheric pillar structure (that is, patterned TPU), ionic TPU having a hemispheric pillar structure (that is, patterned ionic TPU), TPU without having a pillar structure (that is, pristine TPU) and Ionic TPU without having a pillar structure (that is, pristine ionic).

As can be seen from FIG. 8C, in case that the ionic TPU according to the exemplary embodiment is used as the active layer 300, the pressure-dependent variation in the capacitance is found to be big. Further, in case that the general TPU, not ionic, is used as the active layer 300, there is hardly observed a pressure-dependent variation in the capacitance regardless of whether or not they have the pillar structure.

Furthermore, the pressure-dependent variation in the capacitance is found to be big when the ionic TPU having the pillar structure is used as the active layer 300.

FIG. 9A to FIG. 9D are graphs showing a result of measuring various external mechanical pressures by using the capacitor type tactile sensor of the exemplary embodiment.

Figure 9A:
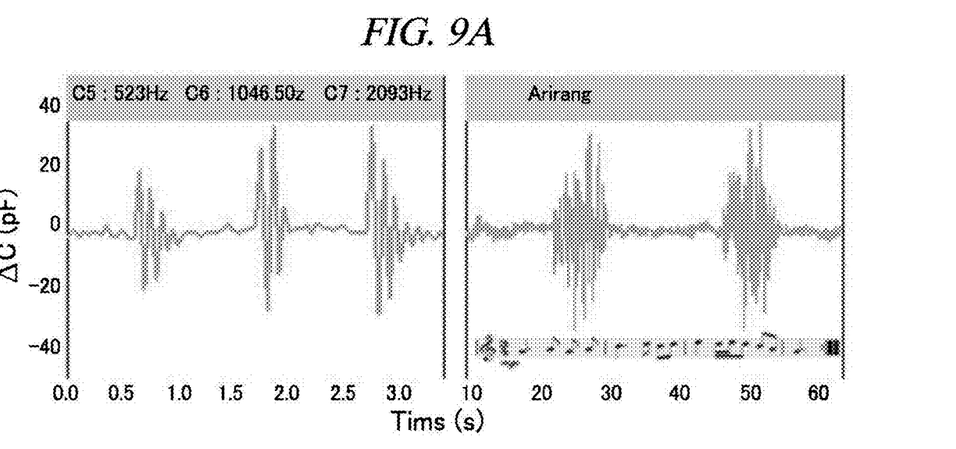
FIG. 9A to FIG. 9D are graphs showing a result of measuring various external mechanical pressures by using the capacitor type tactile sensor according to the exemplary embodiment
Figure 9B:
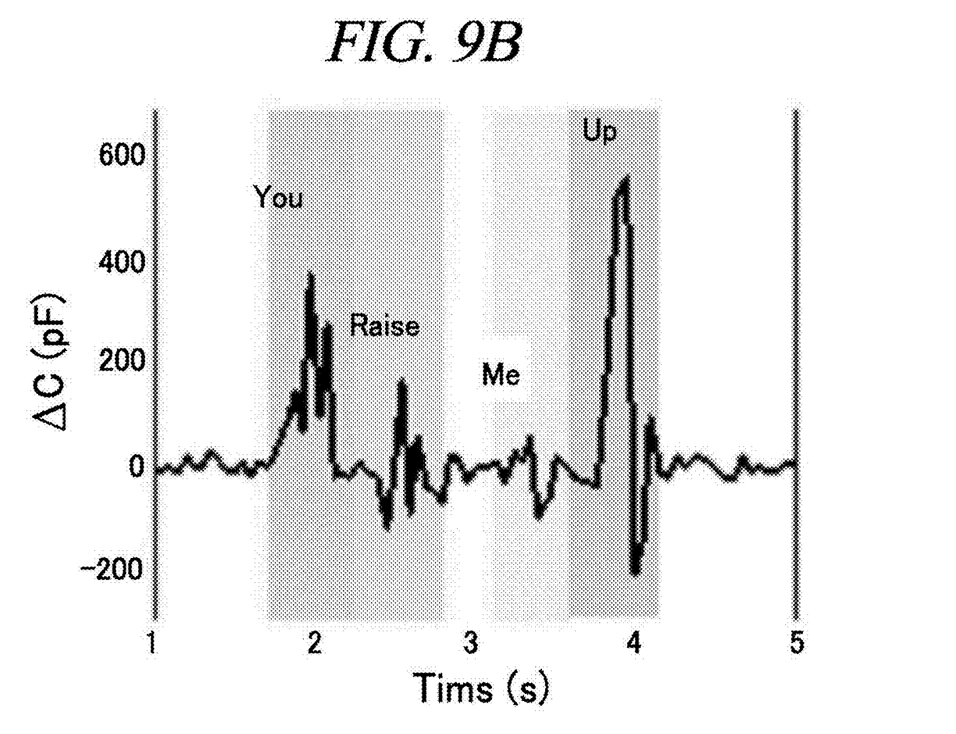
Figure 9C:
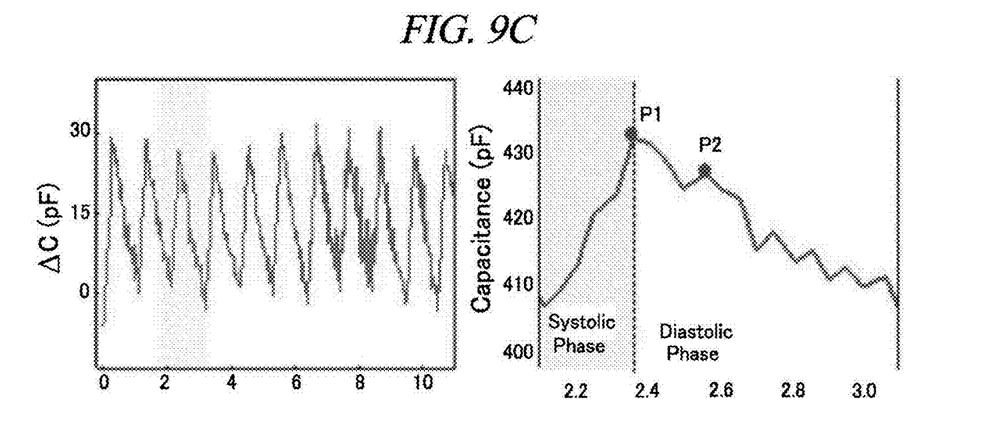
Figure 9D:
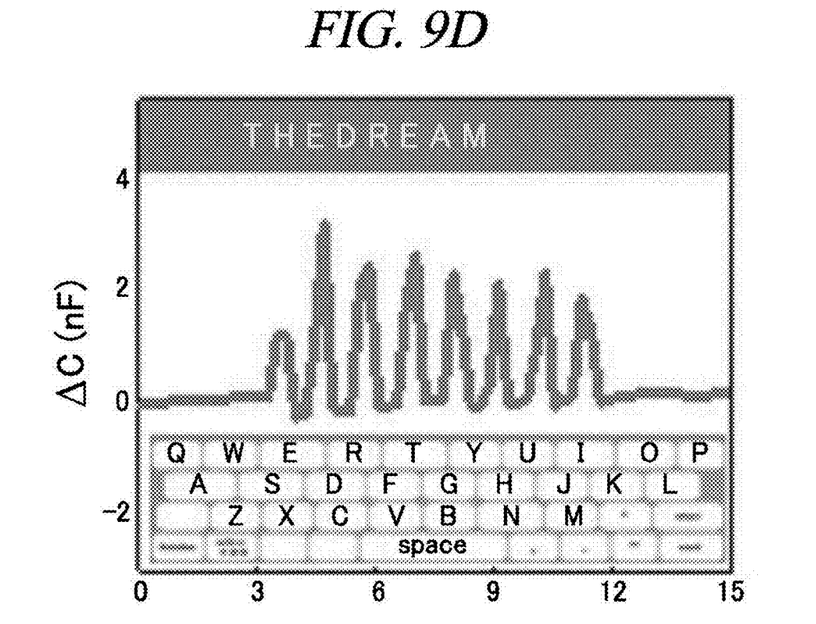

The left graph and the right graph of FIG. 9A show variations in a capacitance value measured in the capacitor type tactile sensor according to the exemplary embodiment when a note of "Do" (left) and a song entitled "Arirang" (right) are given by using a speaker. Through this experiment, the probability of also using the capacitor type tactile sensor as an artificial ear drum can be confirmed. Further, FIG. 9B shows a variation in a capacitance value measured in the capacitor type tactile sensor when a song entitled "You raise me up" is given through vibrations of a receiver of a mobile phone. Through this experiment, the probability of using the capacitor type tactile sensor as an artificial vocal cord can be confirmed. Further, FIG. 9C is a graph showing a result of measuring a pulse by attaching the capacitor tactile sensor to the temple of a person, and FIG. 9D is a graph showing a result of typing a keyboard by attaching the capacitor tactile sensor to a finger of a person. Through these experiments, it can be configured that the capacitor type tactile sensor according to the exemplary embodiment is capable of measuring various external mechanical pressures.

Moreover, though not shown, there is a lower limit of 10.33 Pa in a pressure capable of being measured by the capacitor type tactile sensor according to the exemplary embodiment. That is, this pressure value is the minimum pressure that can be measured by measuring a capacitance variation.

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

We claim:

1. A method of manufacturing a capacitor type tactile sensor, comprising:
    forming a first electrode on a top surface of a first substrate;
    forming an active layer on a top surface of the first electrode;
    forming a second electrode on a top surface of the active layer; and
    placing a second substrate on a top surface of the second electrode,
    wherein the active layer is made of ionic elastomer, and a concentration of effective ions within the active layer is adjusted by an external mechanical pressure,
    wherein the step of forming the active layer comprises:
    injecting liquid-phase ionic elastomer into a mold having a convex-concave structure;
    hardening the liquid-phase ionic elastomer; and
    separating the hardened ionic elastomer from the mold.

2. The method of claim 1,
    wherein the mold having the convex-concave structure is provided with a groove for forming a hemispheric structure.

3. The method of claim 1,
    wherein the mold having the convex-concave structure is provided with a plurality of grooves formed to allow hemispheric structures to be arranged in the form of a array.

4. The method of claim 1,
    wherein the active layer has therein segments configured to partition the inside of the active layer and isolate ions of a certain concentration, and
    the isolated ions are released out into the active layer as partitioned areas of the inside of the active layer are deformed by the external mechanical pressure.

* * * * *

UNITED STATES PATENT AND TRADEMARK OFFICE
CERTIFICATE OF CORRECTION

Page 1 of 1

PATENT NO.         : 10,164,632 B2
APPLICATION NO.    : 15/249592
DATED              : December 25, 2018
INVENTOR(S)        : Do Hwan Kim et al.

It is certified that error appears in the above-identified patent and that said Letters Patent is hereby corrected as shown below:

On the Title Page

Please add:
--(30) Foreign Application Priority Data
August 31, 2015 (KR)...........10-2015-0122502--

Signed and Sealed this
Fifth Day of March, 2019

Andrei Iancu
*Director of the United States Patent and Trademark Office*